United States Patent [19]

Landi et al.

[11] Patent Number: 5,223,568
[45] Date of Patent: Jun. 29, 1993

[54] PROCESS FOR FORMING HARD SHAPED MOLDED ARTICLE OF A CROSS-LINKED LIQUID POLYBUTADIENE OR POLYISOPRENE RESIN AND A BUTADIENE OR ISOPRENE CONTAINING SOLID POLYMER AND RESULTING ARTICLES

[75] Inventors: Vincent R. Landi, Danielson; J. Mark Mersereau, Brooklyn; Walter A. Robbins, Dayville, all of Conn.

[73] Assignee: Rogers Corporation, Rogers, Conn.

[21] Appl. No.: 349,595

[22] Filed: May 9, 1989

Related U.S. Application Data

[63] Continuation-in-part of Ser. No. 50,243, May 14, 1987, abandoned.

[51] Int. Cl.$^5$ .......................... C08C 11/00; C08D 9/02
[52] U.S. Cl. ................................ 524/571; 524/572; 524/574; 524/575; 525/71; 525/89; 525/236; 525/237; 525/281; 525/304; 525/305; 525/314; 525/315; 525/316; 428/625; 428/626; 264/331.13
[58] Field of Search .............. 525/236, 237, 71, 89, 525/314, 304, 305, 315, 316, 281; 524/571, 572, 574, 575

[56] References Cited

U.S. PATENT DOCUMENTS

| | | | |
|---|---|---|---|
| 3,642,687 | 2/1972 | Naarmann et al. | 525/237 |
| 3,644,584 | 2/1972 | Fryd | 260/879 |
| 3,860,672 | 1/1975 | Lagally | 260/859 |
| 3,919,133 | 11/1975 | Dawans et al. | 525/237 |
| 4,017,436 | 4/1977 | Tabana | 260/27 BB |
| 4,197,377 | 4/1980 | Bohm | 525/99 |
| 4,229,550 | 10/1980 | Jones | 525/282 |
| 4,268,433 | 5/1981 | Sawatari | 525/193 |
| 4,370,448 | 1/1983 | Leland | 525/99 |
| 4,384,066 | 5/1983 | O'Shea | 524/394 |
| 4,499,240 | 2/1986 | Valentine | 525/193 |
| 4,554,470 | 11/1985 | Jerson et al. | 524/449 |
| 4,587,300 | 5/1986 | Valentine | 525/95 |
| 4,600,745 | 7/1986 | Creighton | 525/236 |
| 4,704,318 | 11/1987 | Saito et al. | 428/209 |
| 4,789,708 | 12/1988 | Guzy | 525/237 |
| 4,820,764 | 4/1989 | Guzy et al. | 524/526 |

FOREIGN PATENT DOCUMENTS 2648595 5/1977 Fed. Rep. of Germany.

OTHER PUBLICATIONS

"High Vinyl 1-2 Liquid Polybutadiene-Ricon Molding Compound CCS-110" Feb. 1, 1980 Colorado Chemical Spec.
Colorado Chemical Brochure—"Ricon Product Bulletin", Aug. 20, 1985 High Vinyl 1-2 Liquid Polybutadiene.

(List continued on next page.)

Primary Examiner—Melvyn I. Marquis
Assistant Examiner—Frederick Krass
Attorney, Agent, or Firm—Fish & Richardson

[57] ABSTRACT

A forming process for producing a hard shaped molded article that includes subjecting a moldable thermosetting composition to a high temperature cure condition at a temperature greater than about 250° C. and less than the decomposition temperature of the composition to form a crosslinked polymeric network. In particular, the invention features a forming process for producing a hard shaped molded article that includes the steps of (a) providing a moldable thermosetting composition that includes 1) a polybutadiene or polyisoprene resin which is a liquid at room temperature and which has a molecular weight less than 5,000 and a large number of pendent vinyl groups and 2) a solid butadiene- or isoprene-containing polymer (e.g, a thermoplastic elastomer);

(b) forming the composition into a shape; and (c) curing the composition to produce the article including subjecting the composition to a high temperature cure condition at a temperature greater than about 250° C. and less than the decomposition temperature of the composition.

32 Claims, No Drawings

OTHER PUBLICATIONS

Colorado Chemical Brochure—"Ricon Radome" High Vinyl 1-2 Liquid Polybutadiene.
Colorado Chemical Brochure—"Ricon Electrical/Electronic".
Colorado Chemical Brochure—"Ricon Laminating Resins".
Barth et al., *Modern Plastics, pp. 142-148, (Nov. 1970) "Fast-Curing Polybutadiene Thermosetting Resins"*.
Nippon Soda Brochure—"Nisso-PB".
McCreedy et al., Polymer 20 (4) (1979) "Effect of Thermal Crosslinking on Decomposition of Polybutadiene".
Chen, Tenth Electrical Insulation Conf., pp. 318-320 (1978) "Dielectric Properties of Polybutadiene and its Reinforced Composites at Room and Elevated Temperatures".
Takeuchi et al., "A New Thermoplastic Syndiotactic 1,2-polybutadiene," in *New Industrial Polymers*, ACS #4, pp. 15-25.
Bruzzone et al., LaChimica E L'Industria 47 (12) 1298-1302 (1965) "High-Temperature Thermal Crosslinking of Cistactic Polybutadiene".
Shell Product Information re: Kraton Products.

PROCESS FOR FORMING HARD SHAPED MOLDED ARTICLE OF A CROSS-LINKED LIQUID POLYBUTADIENE OR POLYISOPRENE RESIN AND A BUTADIENE OR ISOPRENE CONTAINING SOLID POLYMER AND RESULTING ARTICLES

BACKGROUND OF THE INVENTION

This application is a continuation in part of Landi et al., U.S. Ser. No. 050,243 entitled "Moldable Thermosetting Composition filed May 14, 1987, now abandoned.

This invention relates to moldable thermosetting compositions.

Thermosetting materials are materials that are initially formable but which covalently crosslink when exposed to heat or radiation, thereby forming a three dimensional network that is infusible and insoluble. Thermoplastic materials, on the other hand, become molten and remain so (rather than crosslink) when heated, allowing them to be processed into a variety of shapes at elevated temperatures. Thermoplastic elastomers are block copolymers having thermoplastic blocks that act as physical crosslinks for the material at ambient temperatures but flow when heated, thereby permitting the material to be molded as a thermoplastic.

SUMMARY OF THE INVENTION

In a first aspect, the invention features a forming process for producing a shaped molded article that includes the steps of
(a) providing a moldable thermosetting composition that includes 1) a polybutadiene or polyisoprene resin which is a liquid at room temperature and which has a molecular weight less than 5,000 and contains pendent vinyl groups and 2) a solid butadiene-or isoprene-containing polymer;
(b) forming the composition into a shape; and
(c) curing the composition to produce the article including subjecting the composition to a high temperature cure condition at a temperature greater than about 250° C. and less than the decomposition temperature of the composition.

In preferred embodiments, the solid polymer is a thermoplastic elastomer block copolymer having the formula $X_m(Y-X)_n$ (linear copolymer) or

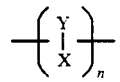

(graft copolymer) where Y is a polybutadiene or polyisoprene block, X is a thermoplastic block, and m and n represent the average block numbers in the copolymer, m being 0 or 1 and n being at least 1. The composition may further include a second thermoplastic elastomer block copolymer having the formula $W_p-(Z-W)_q$ (linear copolymer) or

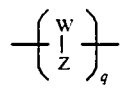

(graft copolymer) where Z is a polyethylene or ethylene-propylene copolymer block,, W is a thermoplastic block, and p and q represent the average block numbers in the copolymer, p being 0 or 1 and q being at least 1.

In a second aspect, the invention features the above-described molding composition with a dielectric filler (i.e., a material having a dielectric constant greater than about 1.2 at microwave frequencies) homogeneously dispersed throughout the composition to the extent that when the composition is cured the properties of the cured, article, e.g., dielectric constant and coefficient of thermal expansion, do not vary more than about 5 % throughout the article.

In preferred embodiments, the molding composition further includes a crosslinking agent capable of co-curing (i.e. forming covalent bonds) with the resin having a molecular weight less than 5,000, thermoplastic elastomer, or both. Examples of preferred crosslinking agents include triallylcyanurate, diallylphthalate, divinyl benzene, a multifunctional acrylate, or combinations of these agents. The volume % of the crosslinking agent as a percentage of the combined volume of the resin, thermoplastic elastomer, and crosslinking agent is preferably less than or equal to 20.

In other preferred embodiments, the resin having a molecular weight less than 5,000 and the polybutadiene or polyisoprene block of the first block copolymer making up the thermoplastic elastomer have at least 90% by weight 1,2 addition. The volume to volume ratio of the resin having a molecular weight less than 5,000 to the thermoplastic elastomer preferably is between 1:9 and 9:1, inclusive.

Preferred thermoplastic blocks for the first or second block copolymer, or both, of the thermoplastic elastomer are styrene and α-methyl styrene. Particularly preferred compositions are those in which the resin is polybutadiene, the first block copolymer is styrene-butadiene-styrene triblock copolymer (m=n=1), and the second block copolymer is styrene-(ethylene-propylene)-styrene triblock copolymer (m=n=1), the ethylene propylene block being the hydrogenated form of an isoprene block.

When the molding composition includes a dielectric filler, the volume % of the filler (based upon the combined volume of resin having a molecular weight less than 5,000, thermoplastic elastomer, crosslinking agent (if any) and filler) is between 5 and 80%, inclusive. Examples of preferred fillers include titanium dioxide (rutile and anatase), barium titanate, strontium titanate, silica (particles and hollow spheres); corundum, wollastonite, polytetrafluoroethylene, aramide fibers (e.g., Kevlar), fiberglass, $Ba_2Ti_9O_{20}$, glass spheres, quartz, boron nitride, aluminum nitride, silicon carbide, beryllia, or magnesia. They may be used alone or in combination.

Useful articles are prepared from the molding compositions by forming the composition into the desired shape (the viscosity of the composition being sufficiently low as a result of the liquid resin such that the shape is readily formed); and curing the composition to a shaped thermoset article (the thermoplastic elastomer maintaining the shape during the cure step). A curing agent (preferably a peroxide) is used to accelerate the cure.

The method of the invention provides a wide variety of shaped articles having favorable isotropic thermal and dielectric properties. These properties can be tailored to match or complement those of ceramic materials, including Gallium Arsenide, alumina, and silica.

Thus, the cured articles can replace ceramic materials in many electronic and microwave applications, e.g., as specialized substrates for high speed digital and microwave circuits. Examples of microwave circuits include microstrip circuits, microstrip antennas, and stripline circuits. The cured products are also useful as rod antennas and chip carriers.

The process offers several advantages. First, the molding compositions are easy to handle because the polybutadiene or polyisoprene resin having a molecular weight less than 5,000 maintains the composition's viscosity at a manageable level. The sizes and shapes that can be prepared are limited only by the mold used. Processing is also economical, especially compared to ceramic processing.

The thermoplastic elastomer portion of the composition prevents the dielectric filler from separating from the resin during processing, thereby preventing the formation of "filler-rich" and filler-poor" regions. Thus, the thermal and dielectric properties of the cured article are substantially uniform throughout the article. The thermoplastic elastomer also reduces the tendency of the composition to crack during molding operations and withstands diffusion in the cured article because it crosslinks with the resin having a molecular weight less than 5,000 during the high temperature cur to form a polymeric network.

The cured articles exhibit good environmental resistance, e.g., to water, high temperature, acid, alkali, and high pressure. Thus, the compositions are useful as encapsulating resins for articles expected to be exposed to such conditions. Furthermore, where the cured composition is to be bonded to a metal, e.g., for use in a circuit board, the low and isotropic coefficient of the thermal expansion of the cured thermoset materials matches that of many metals. Thus, debonding during thermal cycling due to differential thermal expansion of the metal substrate is prevented.

Other features and advantages of the invention will be apparent from the following description of the preferred embodiments thereof, and from the claims.

DESCRIPTION OF THE PREFERRED EMBODIMENTS

We now describe preferred embodiments of the invention.

Structure and Preparation

Preferred thermosetting molding compositions include a polybutadiene or polyisoprene resin portion (molecular weight less than about 5,000, preferably between 1,000-3,000 ) and a thermoplastic elastomer portion. The resin portion, which is a liquid at room temperature, maintains the viscosity of the composition at a manageable level during processing to facilitate handling. It also crosslinks during cure. Polybutadiene and polyisoprene resins having at least 90% 1,2 addition by weight are preferred because they exhibit the greatest crosslink density upon cure owing to the large number of pendent vinyl groups available for crosslinking. High crosslink densities are desirable because the products exhibit superior high temperature properties. A preferred resin is B3000 resin, a low molecular weight polybutadiene liquid resin having greater than 90 wt. % 1,2 addition. B3000 resin is commercially available from Nippon Soda, Ltd.

The thermoplastic elastomer portion maintains the shape into which the composition is formed during molding. It also prevents the filler from separating from the resin and reduces cracking during molding. Furthermore, it participates in crosslinking during cure.

As described in the Summary of the Invention above, the thermoplastic elastomer portion includes a linear or graft type block copolymer that preferably has a polybutadiene or polyisoprene block with at least 90% by weight 1,2 addition and a thermoplastic block that preferably is styrene or α-methyl styrene. The high proportion of 1,2 addition in the polyisoprene or polybutadiene block leads to high crosslink densities after the curing step, as is the case with the polybutadiene or polyisoprene resin described above. A preferred copolymer is a styrene butadiene-styrene triblock copolymer, e.g., Kraton DX1300 (commercially available from Shell Chemical Corp.).

The thermoplastic elastomer may also contain a second block copolymer similar to the first except that the polybutadiene or polyisoprene block is hydrogenated, thereby forming a polyethylene block (in the case of polybutadiene) or an ethylene propylene copolymer (in the case of polyisoprene). When used in conjunction with the first copolymer, materials with particularly low coefficients of thermal expansion can be produced. Where it is desired to use this second block copolymer, a preferred material is Kraton GX1855 (commercially available from Shell Chemical Corp.) which is believed to be a mixture of styrene-high 1,2 butadiene styrene block copolymer and styrene-(ethylene-propylene)-styrene block copolymer.

A crosslinking agent having a functionality $\geq 2$ is added to the thermosetting composition to increase crosslink density upon cure. Examples of preferred crosslinking agents include triallyl cyanurate, diallyl phthalate, divinyl benzene, and multifunctional acrylate monomers (e.g., Sartomer resins available from Arco Specialty Chemicals Co.), all of which are commercially available.

Examples of preferred fillers are recited in the Summary of the Invention, above. Particularly preferred fillers are rutile titanium dioxide and amorphous silica because these fillers have a high and a low dielectric constant, respectively, thereby permitting a broad range of dielectric constants combined with a low dissipation factor to be achieved in the final cured product by adjusting the respective amounts of the two fillers in the composition. To improve adhesion between the fillers and resin, coupling agents, e.g., silanes, are preferably used.

A curing agent is preferably added to the composition to accelerate the curing reaction. When the composition is heated, the curing agent decomposes to form free radicals, which then initiate crosslinking of the polymeric chains. Preferred curing agents are organic peroxides, e.g., Luperox, dicumyl peroxide, and t-butylperbenzoate, all of which are commercially available.

In general, the thermosetting compositions are processed as follows. First, all the ingredients (polybutadiene or polyisoprene resin, thermoplastic elastomer, fillers, coupling agent) are thoroughly mixed in conventional mixing equipment along with a peroxide curing agent. The mixing temperature is regulated to avoid substantial decomposition of the curing agent (and thus premature cure). Mixing continues until the filler is uniformly dispersed throughout the resin.

The homogenized mixture is then removed, cooled, and ground into particles for molding. Next, the particles are poured, pressed, or injected into a mold, e.g., a compression, injection, or transfer mold, or an extruder, and the material is molded into the desired shape. The shaped article is then cured in a two-step cure to a crosslinked thermoset article. First, the article is cured in a conventional peroxide cure step; typical cure temperatures are between 150 and 200° C. Next, the peroxide-cured article is subjected to a high temperature cure step under an inert atmosphere to increase crosslink density. The temperature is greater than about 250° C. but less than the decomposition temperature of the resin (typically about 400° C.). The high temperature cure can be observed to impart an unusually high degree of crosslinking to the final article. The article is then removed and cooled.

The following thermosetting compositions were prepared, molded, and cured. All amounts are given in weight percent. The cured products are hard plastics having relatively low impact strengths.

EXAMPLE 1

| | |
|---|---|
| B3000 resin | 7.6 |
| Kraton DX1300 | 5.1 |
| TiO$_2$ (rutile) | 71.2 |
| SiO$_2$ (amorphous) | 14.5 |
| Kevlar polyaramid fibers | 1.1 |
| Luperox peroxide curative | 0.1 |
| t-butyl perbenzoate curative | 0.1 |
| A189 Silane coupling agent (Union Carbide Corp.) | 0.3 |

EXAMPLE 2

| | |
|---|---|
| B3000 | 10.4 |
| Kraton DX1300 | 7.3 |
| SiO$_2$ (amorphous) | 79.9 |
| E glass fibers | 1.5 |
| Luperox | 0.4 |
| A189 Silane | 0.3 |
| A172 Silane (Union Carbide) | 0.3 |

EXAMPLE 3

| | |
|---|---|
| B3000 | 10.4 |
| Kraton GX1855 | 7.3 |
| SiO$_2$ (amorphous) | 81.3 |
| Luperox | 0.4 |
| A189 Silane | 0.3 |
| A172 Silane | 0.3 |

Other embodiments are within the following claims. We claim:

1. A forming process for producing a hard shaped molded article comprising the steps of
   (a) providing a moldable thermosetting composition comprising
   a polybutadiene or polyisoprene resin which is a liquid at room temperature and which has a molecular weight less than 5,000 and pendent vinyl groups available for crosslinking; and
   an unsaturated butadiene- or isoprene-containing solid polymer capable of participating in crosslinking during cure;
   (b) forming said composition into a shape: and
   (c) curing said composition to produce said article by subjecting said composition to a high temperature cure condition at a temperature greater than about 260° C. and less than the decomposition temperature of said composition.

2. The forming process of claim 1 wherein said solid polymer has pendent vinyl groups available for crosslinking.

3. The forming process of claim 1 wherein said solid polymer is a copolymer of isoprene or butadiene and a second monomer.

4. The forming process of claim 3 wherein said second monomer is styrene or α-methyl styrene.

5. The forming process of claim 3 wherein said copolymer is a thermoplastic elastomer block copolymer having the formula $X_m$—$(Y$—$X)_n$

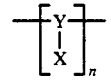

or the formula
where in each formula Y is a block comprising isoprene or butadiene units, X is a thermoplastic block, and m and n represent the average block numbers in said copolymer, m being 0 or 1 and n being at least 1.

6. The forming process of claim 1 wherein said composition further includes a thermoplastic elastomer block copolymer having the formula $W_p$—$(Z$—$W)_q$ or the formula

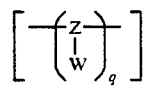

where in each formula Z is a polyethylene or ethylene-propylene copolymer block, W is a thermoplastic block, and p and q represent the average block numbers in said copolymer, p being 0 or 1 and q being at least 1.

7. The forming process of claim 5 or 6 wherein said thermoplastic block is a block comprising styrene or α-methyl styrene units.

8. The forming process of claim 5 wherein the resin which is a liquid at room temperature is polybutadiene and the unsaturated butadiene- or isoprene-containing solid polymer is a styrene-butadiene-styrene triblock copolymer.

9. The forming process of claim 6 wherein the resin which is a liquid at room temperature is polybutadiene, the unsaturated butadiene- or isoprene-containing solid polymer is a styrene-butadiene-styrene triblock copolymer, and said block copolymer is a styrene-ethylene-propylene-styrene triblock copolymer.

10. The forming process of claim 1, further comprising adding to said composition one or more fillers.

11. The forming process of claim 10 adapted to produce a dielectric article wherein the added filler is a quantity of dielectric filler chosen to provide to said article a pre-selected dielectric constant,
   said unsaturated butadiene- or isoprene-containing solid polymer maintaining said added filler dispersed substantially uniformly throughout said composition.

12. The forming process of claim 11 wherein a plurality of said fillers having different dielectric constants are employed, the respective quantities of said fillers being selected to provide to said article a pre-selected dielectric constant.

13. The forming process of claim 12 wherein said composition comprises between 5 and 80% by volume, inclusive, of said filler.

14. The forming process of claim 11 or 12 further comprising applying to said hard shaped molded article a metal layer having a pre-selected coefficient of thermal expansion and, in the process of forming said article, selecting said filler and the quantity thereof to provide to said article a coefficient of thermal expansion substantially equal to that of said metal layer.

15. The forming process of claim 1 further comprising adding a crosslinking agent to said thermosetting composition.

16. The forming process of claim 15 wherein said crosslinking agent is selected from the group consisting of triallyl cyanurate, diallyl phthalate, divinylbenzene, a multifunctional acrylate monomer, and a combination thereof.

17. The forming process of claim 1 wherein curing said composition further includes a step of adding catalyst to said composition and subjecting said composition, prior to said high temperature cure, to a catalyzed cure at a temperature less than the temperature of said high temperature cure.

18. A forming process for producing a hard shaped molded article comprising the steps of
    (a) providing a moldable thermosetting composition comprising
    a polybutadiene or polyisoprene resin which is a liquid at room temperature and which has a molecular weight less than 5,000;
    a thermoplastic elastomer capable of participating in crosslinking during cure comprising a block copolymer having the formula $X_m—(Y—X)_n$ or the formula

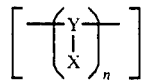

where in each formula Y is a polybutadiene or polyisoprene block, X is a thermoplastic block, and m and n represent the average block numbers in said copolymer, m being 0 or 1 and n being at least 1,
    both the resin which is a liquid at room temperature and said polybutadiene or polyisoprene block of said thermoplastic elastomer having 1,2 addition in an amount such that together they provide pendent vinyl groups available for crosslinking;
    (b) forming said composition into a shape; and
    (c) curing said composition to produce said article by subjecting said composition to a high temperature cure condition at a temperature greater than about 250° C. and less than the decomposition temperature of said composition.

19. The forming process of claim 18 wherein said polybutadiene or polyisoprene block of said thermoplastic elastomer has at least 50% by weight 1,2 addition.

20. An article prepared according to the process of claim 1, 11, or 18.

21. The article of claim 20 wherein said article comprises a microwave lens.

22. The article of claim 20 wherein said article comprises a microwave window.

23. The article of claim 20 wherein said article comprises a filled wave guide cavity.

24. The article of claim 20 wherein said article comprises the substrate for a microwave circuit.

25. The article of claim 24 wherein said microwave circuit comprises a microstrip circuit.

26. The article of claim 24 wherein said microwave circuit comprises a microstrip circuit.

27. The article of claim 24 wherein said microwave circuit comprises a microstrip antenna.

28. The article of claim 24 wherein said microwave circuit comprises a stripline circuit.

29. The article of claim 20 wherein said article comprises a rod antenna.

30. The article of claim 20 wherein said article comprises a substrate for a high speed digital circuit.

31. The article of claim 30 wherein the dielectric constant of said article is substantially the same as that of Gallium Arsenide.

32. The article of claim 20 wherein said article comprises a chip carrier.

* * * * *

UNITED STATES PATENT AND TRADEMARK OFFICE
CERTIFICATE OF CORRECTION

PATENT NO.   : 5,223,568
DATED        : June 29, 1993
INVENTOR(S)  : Vincent R. Landi et al.

It is certified that error appears in the above-identified patent and that said Letters Patent is hereby corrected as shown below:

Column 1,
Line 12, after "Composition" insert -- " --
Line 68, delete "," - the second occurrence Column 2,
Line 9, after "cured" delete ","
Line 39, delete "ethylene propylene" and insert therefor -- ethylene-propylene --

Column 3,
Line 19, insert -- " -- before "filler-poor"
Line 26, delete "cur" and insert therefor -- cure --

Column 4,
Line 6, delete "graft type" and insert therefor -- graft-type --
Line 21, delete "ethylene propylene" and insert therefor -- ethylene-propylene --
Line 28, delete "butadiene styrene" and insert therefor -- butadiene-styrene --

Column 6,
Line 13, after "$X_m-(Y-X)_n$" insert -- or the formula --
Line 20, delete "or the formula"

Line 30, delete "$[(\frac{Z}{W})]$" and insert -- $[(\frac{i}{w})]_\alpha$ -- thererfor Signed and Sealed this Sixteenth Day of October, 2001

*Attest:*

NICHOLAS P. GODICI
*Attesting Officer*   *Acting Director of the United States Patent and Trademark Office*